(12) United States Patent
Anderson et al.

(10) Patent No.: US 8,003,463 B2
(45) Date of Patent: Aug. 23, 2011

(54) STRUCTURE, DESIGN STRUCTURE AND METHOD OF MANUFACTURING DUAL METAL GATE VT ROLL-UP STRUCTURE

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 34 days.

(21) Appl. No.: 12/192,491

(22) Filed: Aug. 15, 2008

(65) Prior Publication Data

US 2010/0041225 A1   Feb. 18, 2010

(51) Int. Cl.
*H01L 21/336* (2006.01)

(52) U.S. Cl. . 438/267; 438/258; 438/275; 257/E21.421; 257/E21.623

(58) Field of Classification Search ............... 438/204, 438/209; 257/E21.177, E21.37, E21.4, E21.477
See application file for complete search history.

(56) References Cited

U.S. PATENT DOCUMENTS

| | | | |
|---|---|---|---|
| 4,714,519 A | 12/1987 | Pfiester | |
| 6,300,177 B1 * | 10/2001 | Sundaresan et al. | 438/197 |
| 6,501,131 B1 | 12/2002 | Divakaruni et al. | |
| 6,586,808 B1 | 7/2003 | Xiang et al. | |
| 6,630,720 B1 | 10/2003 | Maszara et al. | |
| 6,664,153 B2 | 12/2003 | Ang et al. | |
| 7,566,937 B2 | 7/2009 | Wang et al. | |
| 2003/0141525 A1 | 7/2003 | Nowak | |
| 2005/0095852 A1 * | 5/2005 | Saenger et al. | 438/672 |
| 2006/0163661 A1 * | 7/2006 | Wang et al. | 257/369 |
| 2006/0244079 A1 | 11/2006 | Wang et al. | |
| 2007/0262395 A1 | 11/2007 | Gibbons et al. | |

OTHER PUBLICATIONS

Office Action for corresponding U.S. Appl. No. 12/192,517.
Final Office Action dated Aug. 23, 2010, in U.S. Appl. No. 12/192,517.
Notice of Allowance dated Feb. 16, 2011 for related U.S. Appl. No. 12/192,517.

* cited by examiner

*Primary Examiner* — Cheung Lee
(74) *Attorney, Agent, or Firm* — Richard Kotulak; Roberts Mlotkowski Safran & Cole, P.C.

(57) ABSTRACT

A structure, design structure and method of manufacturing is provided for a dual metal gate Vt roll-up structure, e.g., multi-work function metal gate. The method of manufacturing the multi-work function metal gate structure comprises forming a first type of metal with a first work function in a central region and forming a second type of metal with a second work function in at least one edge region adjacent the central region. The first work-function is different from the second work function.

13 Claims, 7 Drawing Sheets

STRUCTURE, DESIGN STRUCTURE AND METHOD OF MANUFACTURING DUAL METAL GATE Vt ROLL-UP STRUCTURE

CROSS-REFERENCE TO RELATED APPLICATIONS

This application is related to U.S. Ser. No. 12/192,517 filed on the same day and currently pending.

FIELD OF THE INVENTION

The present invention generally relates to a design structure, and more particularly, to a structure, design structure and method of manufacturing a dual metal gate Vt roll-up structure.

BACKGROUND OF THE INVENTION

CMOS processing requires both NMOS and PMOS devices. In these devices, high-k/metal gate implementation requires a metal that works for NMOS (typically of workfunction between 4.2 eV and 4.6 eV) and a metal that works for PMOS (typically of workfunction between 4.8 eV and 5.2 eV). This constitutes the material requirements of two "work function" metals (properties capable of achieving $V_t$), one needed for each device. The work function metals between 4.2 eV to 4.6 eV and 4.8 to 5.2 eV are needed to adjust the $V_t$ of the NMOS and PMOS devices, respectively.

In conventional processing of CMOS, a single metal is used in the gate fabrication of the NMOS and another single metal is used for the gate fabrication of the PMOS. Also, it is known that most metals with high work function have stable bulk characteristics after high thermal processing. However, these metals alter their interface characteristics with the high-k dielectric after high-temperature processing which manifests itself as $V_t$ variation and dielectric leakage. These conditions lead to decreased device reliability.

Devices with workfunctions nearer to the silicon midgap energy require lower values of channel doping in order to achieve proper Vt This to leads to difficulties in controlling Vt roll-off, that is, the rapid change in Vt with variation in gate length, thereby leading to Vt tolerance degradation, which is especially detrimental to analog circuits.

Accordingly, there exists a need in the art to overcome the deficiencies and limitations described hereinabove.

SUMMARY

In a first aspect of the invention, a method of manufacturing a multi-work function metal gate structure comprises forming a first type of metal with a first work function in a central region and forming a second type of metal with a second work function in at least one edge region adjacent the central region. The first work-function is different from the second work function.

In an additional aspect of the invention, a method of manufacturing a multi-work function metal gate structure comprises forming a first gate structure and a second gate structure. The first metal gate structure comprises a near conduction band metal in a central region and a near valence band metal in at least one edge region. The second metal gate structure comprises a near valence band metal with the second work function in a central region and the near conduction valence band metal.

In a further aspect of the invention, a method comprises forming a first type of metal gate for a CMOS structure. The method comprises: depositing a high-k dielectric material on a substrate; forming a first metal type being one of a near valence band and a near conduction band on the high-k dielectric material; etching a central region of the first metal type to expose the high-k dielectric region; forming a second metal type being one of the near conduction band and a near valence band, respectively, within the etched central region; and polishing the second metal type.

BRIEF DESCRIPTION OF SEVERAL VIEWS OF THE DRAWINGS

The present invention is described in the detailed description which follows, in reference to the noted plurality of drawings by way of non-limiting examples of exemplary embodiments of the present invention.

FIGS. 1-3h show structures and processes for fabricating the structure in accordance with a first aspect of the invention;

DETAILED DESCRIPTION

The present invention generally relates to a design structure, and more particularly, to a structure, design structure and method of manufacturing a dual metal gate Vt roll-up structure. More specifically, the present invention is directed to a dual metal gate Vt roll-up structure used for metal gate high-k technologies. By implementing the invention it is now possible to improve Vt-roll-off, which can expand the manufacturing process window for metal gates in high-k technologies.

In embodiments, the present invention is directed to an integrated circuit structure which comprises a multi-work function-gate FET. The multi-work function-gate FET can include a FET of a first metal type with a first work function and a FET of a second metal type with a second work function. In particular, each FET includes a channel and a gate electrode above the channel. The gate electrode includes a central region and at least one edge region. (It should be understood by those of skill in the art that central does not necessarily refer to as an absolute center portion, but may mean near a center or about a center region.) The central region has a metal of a first work-function and the second region has a metal of a second work function. Also, the first region can be co-formed with a first type-FET gate electrodes and the second region can be co-formed with second-type-FET gate electrodes, in accordance with aspects of the invention.

More specifically, in implementations of the present invention, in a CMOS metal gate high-k nFET, the metal gate stack includes a central portion with a near conduction band and an edge portion with a near valence band. In a CMOS metal gate high-k pFET, the metal gate stack includes a central portion with a near valence band and an edge portion with a near conduction band.

As should be understood by those of skill in the art, the valence band is the highest range of electron energies where electrons are normally present at absolute zero. Semiconductors owe their low conductivity to the properties of the valence band. In semiconductors, there is also a band gap above the valence band, followed by a conduction band above the band gap. The conduction band is the range of electron energy, higher than that of the valence band, sufficient to make the electrons free to accelerate under the influence of an applied electric field and thus constitute an electric current. Electrons may cross this band gap when they are excited.

Structure and Fabrication of a First Aspect of the Invention

FIGS. 1-3*h* show intermediate structures and processes for fabricating the structure in accordance with a first aspect of the invention. In particular, FIGS. 1-3*h* show intermediate structures and processes for fabricating a CMOS metal gate high-k nFET with a gate stack engineered Vt roll-up.

Figure 1:
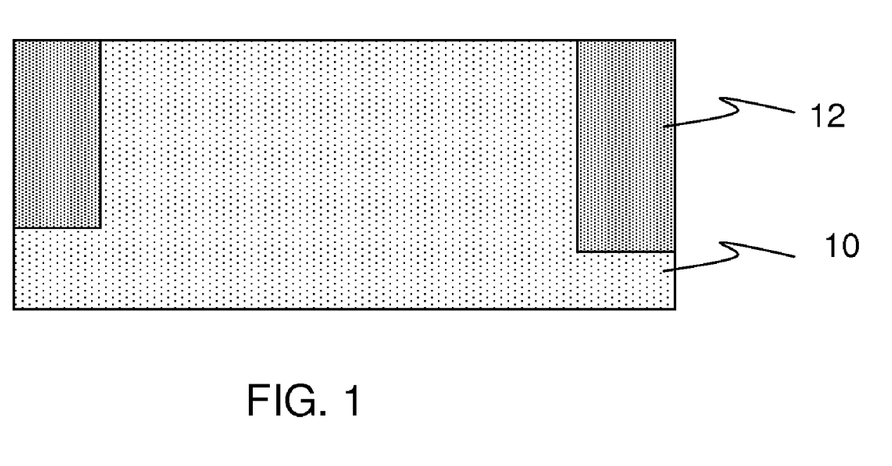

FIG. 1 shows a conventional wafer body or substrate 10, such as a silicon wafer. In embodiments, the substrate 10 is etched using a conventional etching process such as, for example, a reactive ion etching (RIE) process to form trenches. The trenches are subsequently filled with, e.g., an oxide material, to form conventional shallow trench isolation structures (STI) 12. The STI 12 will act as isolation structures between gate structures, for example, formed in later processes.

Figure 2:
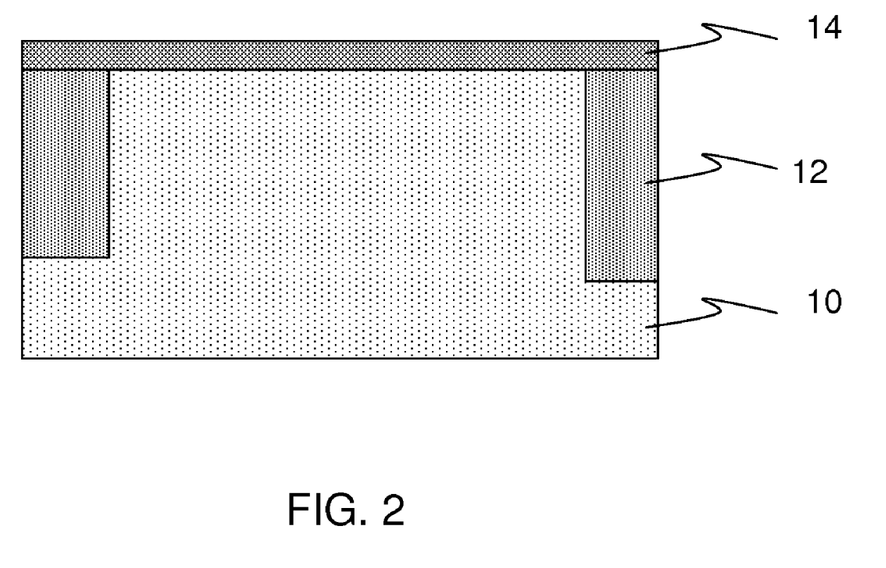

In FIG. 2, a dielectric film 14 such as, for example, an oxide or nitride, is deposited over the structure of FIG. 1. In embodiments, the film 14 is deposited using conventional deposition processes such as, for example, chemical vapor deposition, or atomic layer deposition processes. The dielectric film 14 can be a high-k dielectric, such as an oxide of hafnium.

Figure 3A:
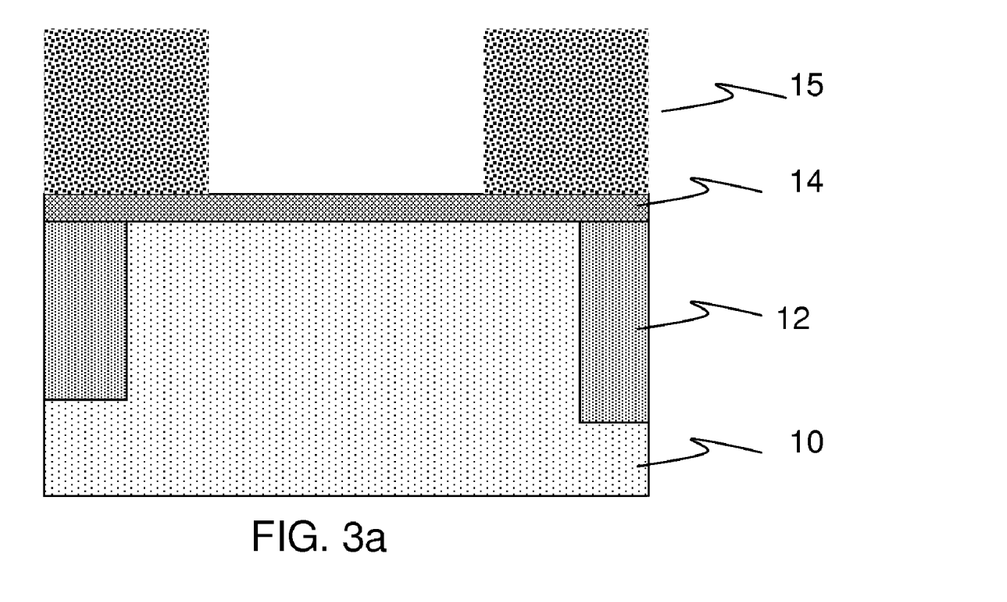
Figure 3B:
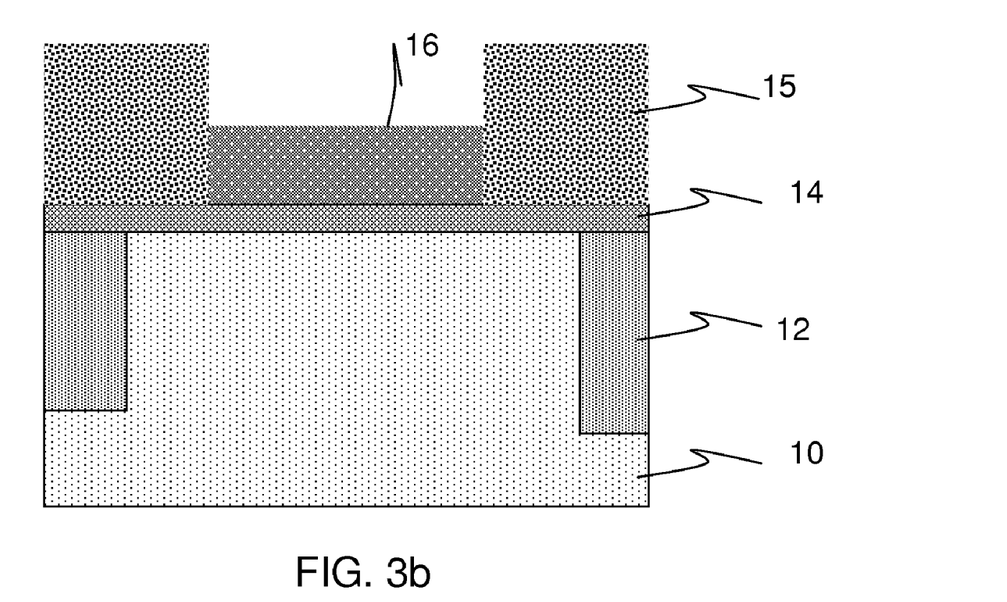

In FIG. 3*a*, a mandrel material 15, such as silicon dioxide is deposited and patterned over dielectric film 14. In FIG. 3*b*, a first metal type 16 is deposited on the structure of FIG. 3*a*. In embodiments, the first metal type 16 is a near valence band metal used for a gate stack. The near valence band metals contemplated by the present invention include, for example, magnesium or magnesium alloys, platinum, boron-doped nickel silicide.

In embodiments, the near valance band metals have a certain work function, which can range from about 4.8 eV to about 5.2 eV. The first metal 16 is planarized to the top of the mandrel and further recessed by selective etching.

Figure 3C:
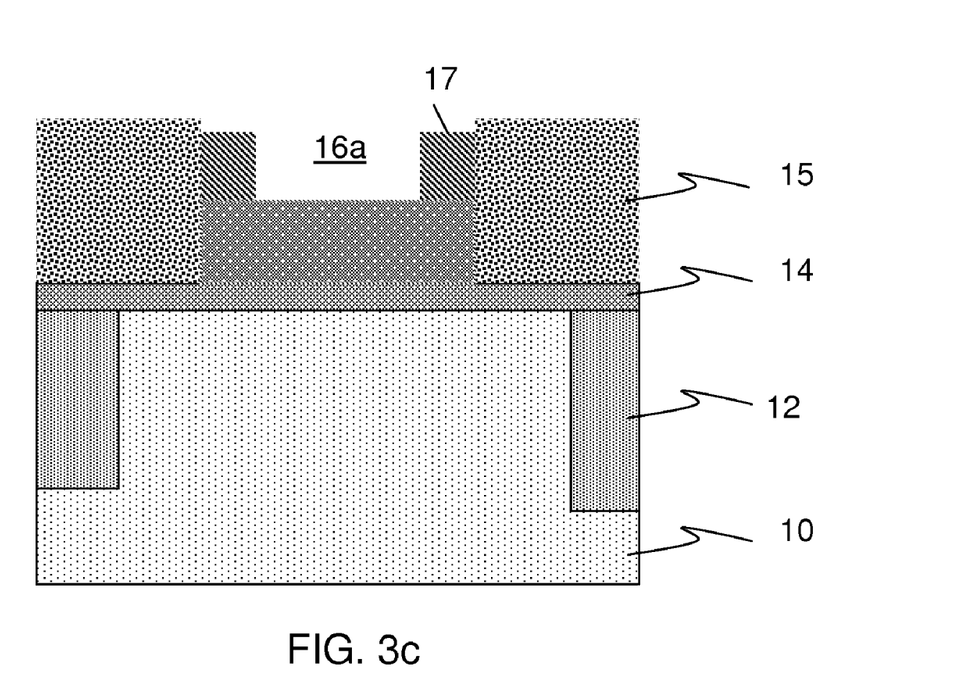

In FIG. 3*c*, spacer material 17, such as silicon nitride, is deposited on the structure of FIG. 3*b*, including within opening 16*a*. The spacer material 17 is then anisotropically etched to leave the material only along the sidewalls of the mandrel 16 as shown.

Figure 3D:
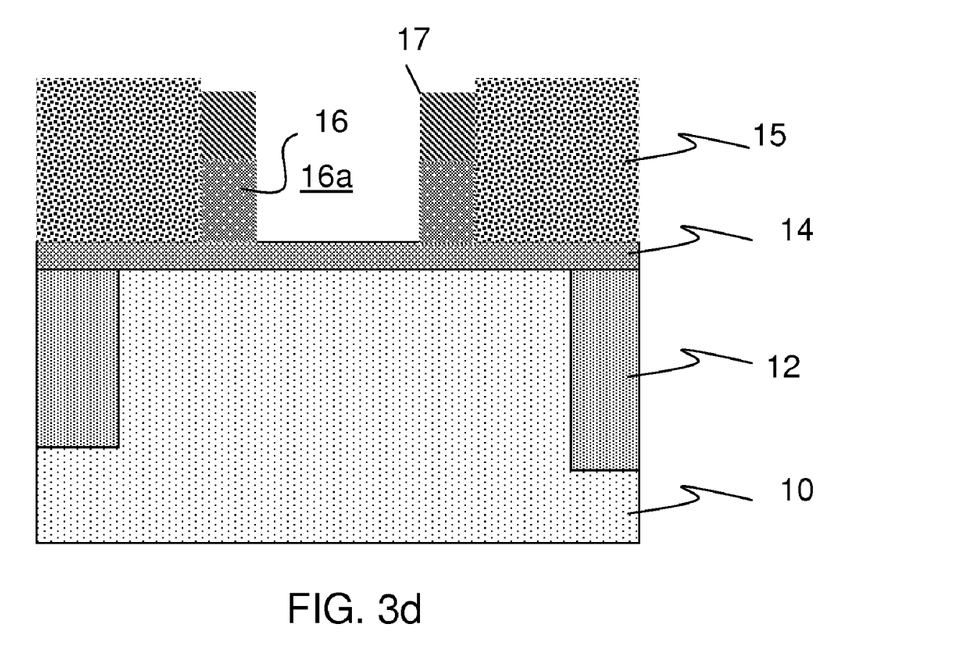
Figure 3E:
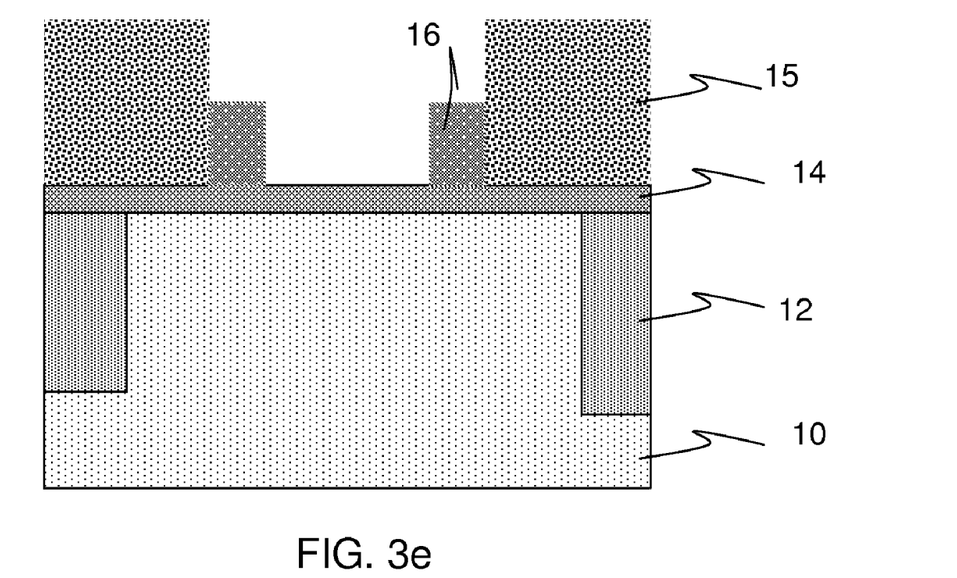

In FIG. 3*d* the exposed first metal 17 is selectively anisotropically etched leaving only portions of the metal protected by the spacer 17. In FIG. 3*e* the remaining spacer material is removed by selective etching.

Figure 3F:
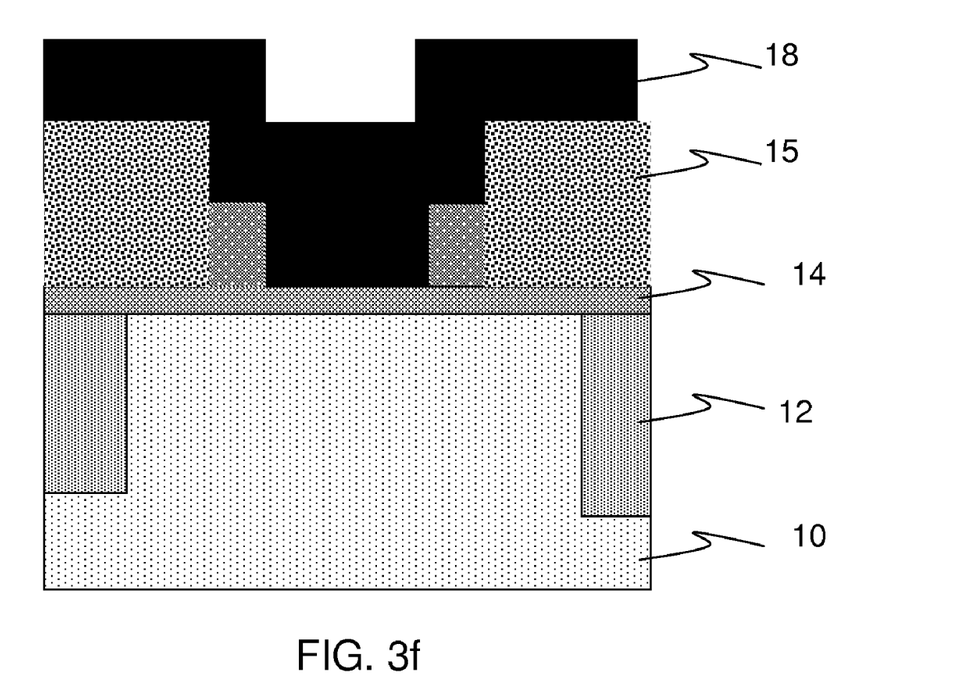

In FIG. 3*f*, a second metal type 18 is deposited on the structure of FIG. 3*e*, including within the opening 16*a*. This allows the second metal type 18 to be deposited within the opening 16*a*, and over portions of the first metal type 16. The second metal type 18 is a near conduction band metal used in the gate stack. The types of near conduction band metals contemplated by the invention include, for example, aluminum, or arsenic-doped nickel silicide.

In embodiments, the near conduction band metals have a certain work function, which can range from about 4.2 eV to about 4.6 eV. The work functions of the second metal type 18 are different from the work functions of the first metal type 16.

Figure 3G:
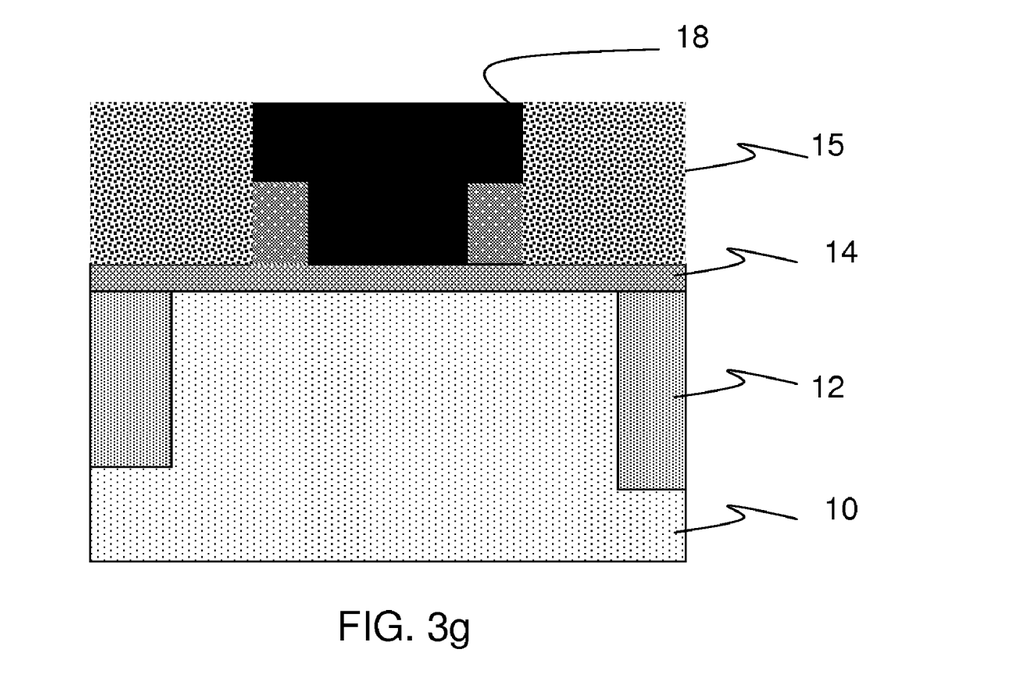
Figure 3H:
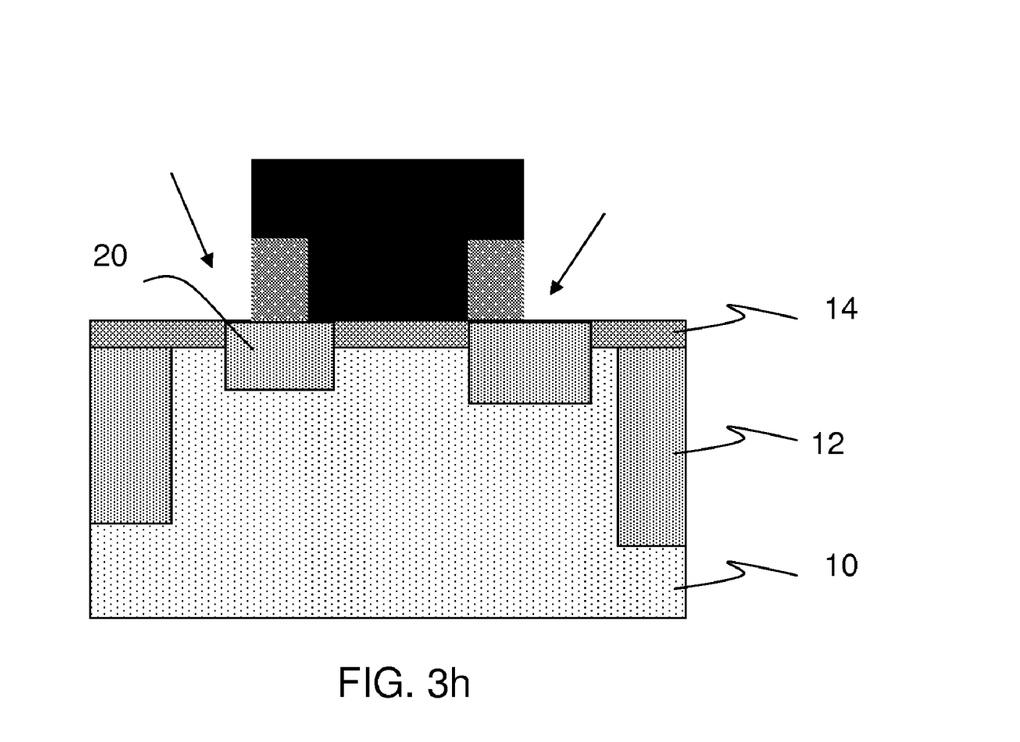

In FIG. 3*g*, the second gate electrode material 18 is planarized by e.g. CMP/RIE to about the top surface of the mandrel 15. FIG. 3*h* shows a final structure and respective processes for fabricating the structure in accordance with the first aspect of the invention. As shown in FIG. 3*h*, the remaining mandrel material is selectively removed. The source/drain regions 20 of the gate structure (which comprises the second metal type 18 surrounded by the first metal type 16) is then subject to a conventional doping process. As the formation of the source and drain regions are known to those of skill in the art, no further explanation is required herein.

In embodiments, the near conduction band metal (second metal type 18) is a minimum gate length range image. In embodiments, for 45 nm technologies, the minimum gate length ranges from about 35 nm to 50 nm and preferably about 40 nm. For example, the second metal type 18 may be, for example, about 0.5 to about 0.75 of a minimum gate length. On the other hand, for example, the near valence band metal (first metal type 16) may be about 0.1 to about 0.3 of the minimum gate length.

In further embodiments, it should be understood that the second metal type 18 can be deposited and patterned prior to the deposition and polishing of the first metal type 16. In this embodiment, the first metal type 16 may be deposited along the edges of the patterned second metal type 18.

Structure and Fabrication of a Second Aspect of the Invention

Figure 4:
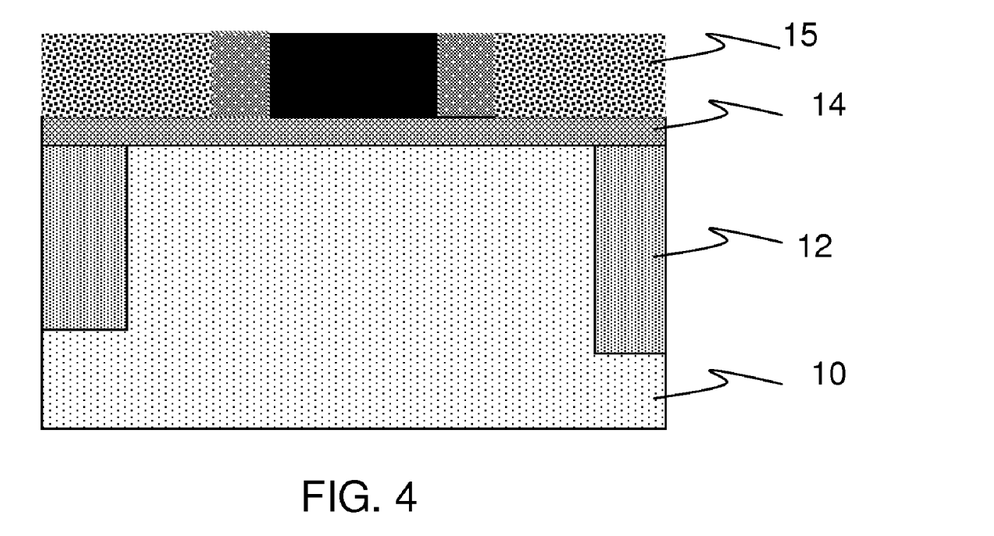
FIGS. 4 and 5 show structures and processes for fabricating the structure in accordance with a second aspect of the invention.

In FIG. 4 starting from the structure of FIG. 3*g*, further processing includes etching back the portions of the mandrel 15 and second metal 18 until approximately the top surface of the first metal 17 is exposed.

Figure 5:
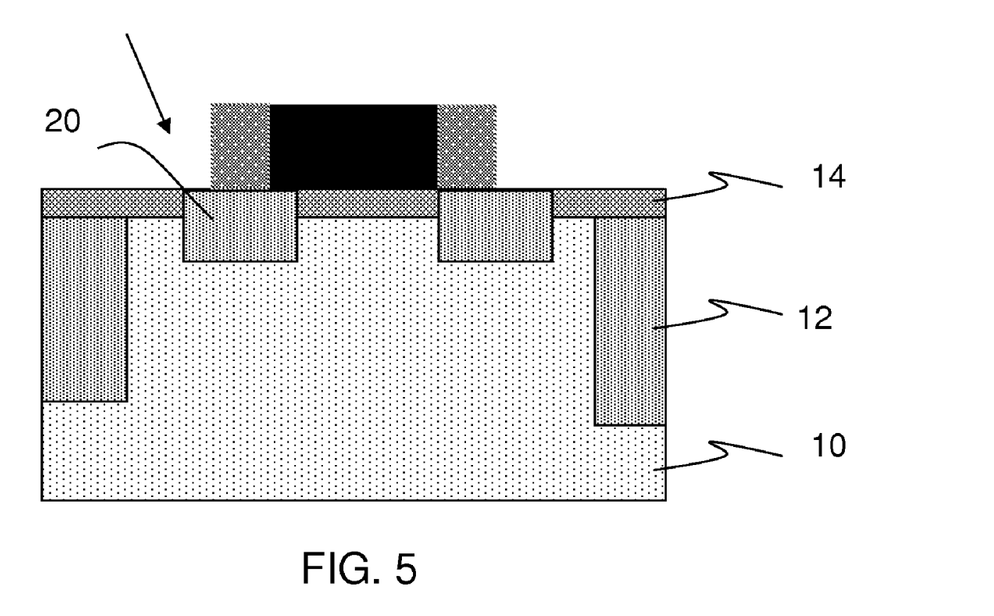

FIG. 5 shows a final structure and respective processes for fabricating the structure in accordance with the first aspect of the invention. As shown in FIG. 5, the remaining mandrel material is selectively removed. The source/drain regions 20 of the gate structure (which comprises the second metal type 18 surrounded by the first metal type 16) is then subject to a conventional doping process. As the formation of the source and drain regions are known to those of skill in the art, no further explanation is required herein.

It should be noted that the same processes can be used for the formation of pFET. For example, the present invention would have the reverse metal workfunctions to form the pFET. As such, a further explanation is not required herein for those of skill in the art to understand the invention.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Design Structure

Figure 6:
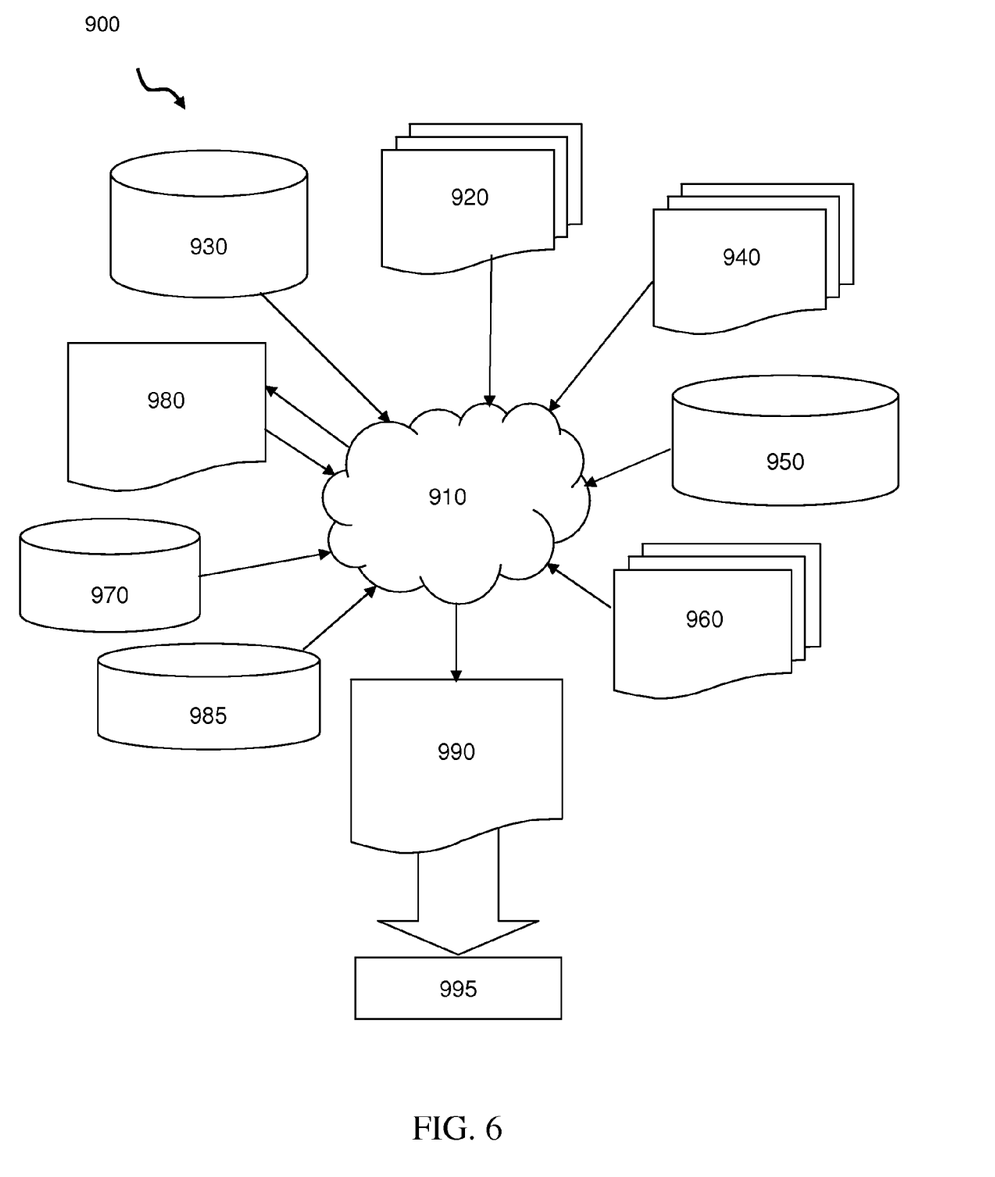
FIG. 6 is a flow diagram of a design process used in semiconductor design, manufacture, and/or test.

FIG. 6 shows a block diagram of an exemplary design flow 900 used for example, in semiconductor IC logic design, simulation, test, layout, and manufacture. Design flow 900 includes processes and mechanisms for processing design structures to generate logically or otherwise functionally equivalent representations of the embodiments of the invention shown in FIGS. 1-5. The design structures processed and/or generated by design flow 900 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 6 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-5. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-5 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include modules for performing standard circuit design processes such as timing analysis, verification, design rule checking, place and route operations, etc.

Design process 910 employs and incorporates well-known logic and physical design tools such as HDL compilers and simulation model build tools to process design structure 920 together with some or all of the depicted supporting data structures to generate a second design structure 990. Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 990 may comprise a compiled, executable HDL simulation model that functionally simulates the devices shown in FIGS. 1-5.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 6 and 12. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method of manufacturing a multi-work function metal gate structure, comprising:
   depositing a first type of metal with a first work function on a structure;
   depositing a spacer material on the first type of metal;
   etching a central region of the spacer material and the first type of metal such that the first type of metal is in at least one edge region adjacent to the central region; and
   depositing a second type of metal with a second work function in the central region, the first work-function being different from the second work function.

2. The method of claim 1, wherein the second type of metal is a near conduction band metal and the first type of metal is a near valence band metal.

3. The method of claim 2, wherein the metal gate structure is a metal gate high-k nFET.

4. The method of claim 3, wherein the first type of metal surrounds the second type of metal.

5. The method of claim 1, wherein:
   the second type of metal with a second work function includes one of: aluminum, arsenic-doped nickel silicide; and
   the first type of metal with a first work function includes-one of: magnesium, magnesium alloy, and boron-doped nickel silicide.

6. The method of claim 1, wherein the second type of metal is a near valence band metal and it is one of magnesium and magnesium alloy and the first type of metal is a near conduction band metal.

7. The method of claim 6, wherein the metal gate structure is a metal gate high-k pFET.

8. The method of claim 1, further comprising forming a second gate structure which comprises forming the first type of metal with the first work function in the central region and the second type of metal with the second work function in at least one edge region adjacent the central region.

9. The method of claim 1, further comprising polishing the second type of material after the depositing of the second type of material.

10. The method of claim 1, wherein the first type of metal is deposited prior to the second type of metal in the central region.

11. The method of claim 1, further comprising:
    removing the spacer material by selective etching, the spacer material comprising a silicon nitride;
    depositing the second type of metal in the central region and over portions of the first type of metal in the at least one edge region adjacent the central region; and
    etching the second type of metal until a top surface of the first type of metal is exposed.

12. A method of manufacturing a multi-work function metal gate structure, comprising:
    depositing a single dielectric layer having a uniform thickness;
    depositing a first type of metal with a first work function on the dielectric layer;
    depositing a spacer material on the first type of metal;
    etching a central region of the spacer material and the first type of metal such that the first type of metal is in at least one edge region adjacent to the central region on the dielectric layer; and
    depositing a second type of metal with a second work function in the central region on the dielectric layer,
    wherein the first work-function is different from the second work function, and the first type of metal is about an edge region of the second type of metal, the second type of metal being deposited after the first type of metal.

13. The method of claim 12, further comprising:
    removing the spacer material by selective etching, the spacer material comprising a silicon nitride;
    depositing the second type of metal in the central region on the dielectric layer and over portions of the first type of metal in the at least one edge region adjacent the central region on the dielectric layer; and
    etching the second type of metal until a top surface of the first type of metal is exposed.

* * * * *